United States Patent
Suzuki et al.

(10) Patent No.: US 6,858,154 B2
(45) Date of Patent: Feb. 22, 2005

(54) THERMOELECTRIC MATERIAL AND METHOD OF MANUFACTURING THE SAME

(75) Inventors: Akiko Suzuki, Tokyo (JP); Izumi Kataoka, Tokyo (JP)

(73) Assignee: Japan Aviation Electronics Industry Limited, Tokyo (JP)

(*) Notice: Subject to any disclaimer, the term of this patent is extended or adjusted under 35 U.S.C. 154(b) by 355 days.

(21) Appl. No.: 09/946,755

(22) Filed: Sep. 4, 2001

(65) Prior Publication Data

US 2002/0026856 A1 Mar. 7, 2002

(30) Foreign Application Priority Data

Sep. 4, 2000 (JP) .................. 2000-267328

(51) Int. Cl.[7] .................. H01L 35/34; C23C 14/28; B32B 15/00
(52) U.S. Cl. .................. 252/62.3; 252/500; 252/518.1; 252/519.4; 136/236.1; 136/201; 257/930; 428/357; 428/432; 428/699
(58) Field of Search .................. 252/62.3, 500, 252/518.1, 519.1; 136/236.1, 201; 257/930; 428/357, 432, 699

(56) References Cited

U.S. PATENT DOCUMENTS

| | | | |
|---|---|---|---|
| 4,447,277 A | | 5/1984 | Jayadev et al. |
| 4,835,059 A | * | 5/1989 | Kodato .................. 428/432 |
| 5,470,910 A | | 11/1995 | Spanhel et al. |
| 5,525,162 A | * | 6/1996 | Horn et al. .................. 136/201 |
| 5,952,040 A | * | 9/1999 | Yadav et al. .................. 427/126.3 |
| 6,060,656 A | * | 5/2000 | Dresselhaus et al. ....... 136/205 |
| 6,225,548 B1 | | 5/2001 | Sakakibara et al. |
| 6,521,909 B2 | * | 2/2003 | Yamaguchi et al. .......... 257/19 |
| 6,648,975 B2 | * | 11/2003 | Suzuki et al. .................. 118/722 |

FOREIGN PATENT DOCUMENTS

| | | | | |
|---|---|---|---|---|
| DE | 04118152 | * | 12/1992 | .............. B22F/1/00 |
| DE | 4118152 | | 12/1992 | |
| JP | 05013821 | | 1/1993 | |
| JP | 05-013821 | * | 1/1993 | ........... H01L/35/04 |
| JP | 09275075 | | 10/1997 | |
| JP | 10004220 | | 1/1998 | |
| JP | 10-004220 | * | 3/1998 | ........... H01L/35/20 |
| JP | 10242535 | | 9/1998 | |
| JP | 10-242535 | * | 9/1998 | ........... H01L/35/14 |
| JP | 2001589561 | | 6/2001 | |
| JP | 2001-158956 | * | 6/2001 | ........... C23C/14/28 |

OTHER PUBLICATIONS

Yoshida et al, Appl. Phys. Lett. 1996, V68(13), pp1772–1774.*
Liao et al, J. Appl. Phys. 1999, V86(6), pp 3204–3206.*
Cronin et al, "Thermoelectric Investigation of Bismuth nanowires", 18th Intl. Conf. Thermoelectrics, 1999, pp 554–557.*
Cronin, S. B., et al., "Thermoelectric investigation of bismuth nanowires" 18th Int'l. Conf. on Thermoelectrics, IEEE, USA ISBN: 0–7803–5451–6, p. 554–557.
Yoshida, T., et al: "Nanometer–Sized Silicon Crystallites Prepared By Excimer Laser Ablation In Constant Pressure Inert Gas," Applied Physics Letters, American Institute of Physics. New York, US, vol. 68, No. 13, pp. 1772–1774.

* cited by examiner

Primary Examiner—Mark Kopec
Assistant Examiner—Kallambella Vijayakumar
(74) Attorney, Agent, or Firm—David N. Lathrop, Esq.; Gallagher & Lathrop (57) ABSTRACT

A thermoelectric material having large thermoelectric figure of merit is provided. A thin film comprising nanometer-sized particles having their diameters distributing within the range of 0.5 nm though 100 nm both inclusive is formed by depositing the nanometer-sized particles on a substrate, or dispersing the particles in a solid matrix material or solution thereby to form a thin film. In the thin film, a band gap due to quantum confinement effect is generated in each of the particles and electrical conduction occurs by that at least a part of the particles supply carriers. Accordingly, thermal conductivity κ as well as electrical resistivity ρ and Seebeck coefficient S all of which are factors of thermoelectric figure of merit can be independently controlled, and it is possible to get a thermoelectric material having large dimensionless thermoelectric figure of merit ZT such as beyond 1.5.

10 Claims, 3 Drawing Sheets

THERMOELECTRIC MATERIAL AND METHOD OF MANUFACTURING THE SAME

BACKGROUND OF THE INVENTION

1. Field of the Invention

The present invention relates to a thermoelectric material consisting of a substance having a new and novel structure and/or configuration and a method of manufacturing the thermoelectric material.

2. Description of the Related Art

Heretofore, chalcogenide system materials such as $Bi_2Te_3$, PbTe and the like, Si—Ge system mixed crystal materials, or the like have been taken up as thermoelectric materials. Thermoelectric figure of merit Z that determines the efficiency of thermoelectric conversion in a thermoelectric material is expressed by the following equation using thermal conductivity $\kappa$, electrical resistivity $\rho$ and Seebeck coefficient (thermally generated electromotive force per unit temperature difference) S.

$$Z = S^2/\kappa\rho$$

The figure of merit Z has a dimension that is the reciprocal of temperature T, and there are many cases that the product ZT of the figure of merit Z and the temperature T is used as the dimensionless or zero-dimensional thermoelectric figure of merit. From the above equation, it may be said that a material having good thermoelectric conversion efficiency is a substance which is large in Seebeck coefficient S as well as is small in both electrical resistivity $\rho$ and thermal conductivity $\kappa$.

Incidentally, almost all of thermoelectric materials that have been practically used until now have been semiconductors, and yet have been limited to degenerate semiconductors having high mobility as cited above. This is due to the following reasons.

In case conduction will occur by band electrons (or holes), since $\kappa$, $\rho$ and S all depend upon density of carriers (carrier density) n, Z is a function of n and comes to the maximum in the order of $n=n_0=10^{19}$ cm$^{-3}$. This corresponds to the carrier density of a semiconductor having electrons or holes in comparatively high density (since its energy distribution forms degenerated Fermi distribution, it is called a degenerate semiconductor).

On the other hand, heat is conveyed not only by conduction electrons but also by lattice vibration (phonon), and the thermal conductivity $\kappa$ is expressed by the following equation as the sum of contribution of electron and contribution of lattice.

$$\kappa = \kappa_{electronic} + \kappa_{lattice}$$

$\kappa_{electronic}$ is determined depending upon the carrier density, but $\kappa_{lattice}$ depends upon elements constituting the material and/or structure of the material.

Accordingly, in order to obtain small $\rho$ and $\kappa$ under the optimum carrier density $n_0$, there is no alternative but to increase the mobility and to reduce the thermal conductivity $\kappa_{lattice}$ conveyed by phonon. For that reason, all the prior thermoelectric materials were degenerate semiconductors each having high mobility, and a contrivance has been done, which intends to decrease mean free path of phonon thereby to reduce $\kappa_{lattice}$ by using heavy elements such as Bi, Te, Pb and/or by making the materials mixed crystallization.

However, a design for substance based on the prior crystalline semiconductor materials is of less degree of freedom in controlling individually the electrical nature or property and the thermal nature or property of a material, and in practice, if an element or elements constituting a crystal and structure thereof are determined, values of $\kappa$, $\rho$ and S are substantially bounded to known ones. Accordingly, it is difficult to attain a design for substance in which S, $\rho$ and $\kappa_{lattice}$ can be individually controlled to greatly improve the efficiency of thermoelectric conversion, and it has not been materialized to put a thermoelectric material having large ZT, such as beyond 1.5, to practical use.

SUMMARY OF THE INVENTION

It is an object of the present invention to provide a thermoelectric material having a new and novel substance structure in which Seebeck coefficient S and the electrical resistivity $\rho$ thereof can be controlled to get the maximum thermoelectric figure of merit Z as well as the thermal conductivity $\kappa_{lattice}$ thereof can be reduced down to the same level as that of a glass material.

It is another object of the present invention to provide a thermoelectric material in which the product ZT of the thermoelectric figure of merit Z and temperature T is large, such as beyond 1.5.

It is a further object of the present invention to provide a method of manufacturing a thermoelectric material having a new and novel substance structure in which Seebeck coefficient S and the electrical resistivity $\rho$ thereof can be controlled to get the maximum thermoelectric figure of merit Z as well as the thermal conductivity $\kappa_{lattice}$ thereof can be reduced down to the same level as that of a glass material.

It is a still further object of the present invention to provide a method of manufacturing a thermoelectric material in which the product ZT of the thermoelectric figure of merit Z and temperature T is large, such as beyond 1.5.

In order to accomplish the aforesaid objects, there is provided, in a first aspect of the present invention, a thermoelectric material formed by depositing nanometer-sized particles having their diameters distributing within the range of 0.5 nm though 100 nm both inclusive on a substrate, or dispersing nanometer-sized particles having their diameters distributing within the range of 0.5 nm though 100 nm both inclusive in a solid matrix material, or dispersing nanometer-sized particles having their diameters distributing within the range of 0.5 nm though 100 nm both inclusive in a solution and forming a thin film from the nanometer-sized particles deposited on the substrate or the solid matrix material or the solution in which the nanometer-sized particles having been dispersed. In these thermoelectric materials, a band gap due to quantum confinement effect is generated in each of the nanometer-sized particles and electrical conduction of the thermoelectric material occurs by that at least a part of the nanometer-sized particles supply carriers. In addition, Seebeck coefficient is characterized in that it susceptibly depends upon a change of band structure due to quantum confinement effect.

In a preferred embodiment, the surface of each of the nanometer-sized particles is coated with a matter phase of a different kind.

In a second aspect of the present invention, there is provided a method of manufacturing a thermoelectric material comprising the steps of: irradiating a target material with pulsed laser light in an inert gas the pressure of which is set at 0.1 Torr through 760 Torr both inclusive, causing the target material to emitting atoms therefrom by laser ablation, and producing nanometer-sized particles having their diameters distributing within the range of 0.5 nm though 100 nm both inclusive; taking the produced nanometer-sized particles out in a high vacuum as a beam through a nozzle; and depositing the particles taken out in the high vacuum on a substrate, or dispersing the particles taken out in the high vacuum in a solid matrix material on a substrate, or dispersing the particles taken out in the high vacuum in a solution.

In a preferred embodiment, the aforesaid manufacturing method includes the step of forming a matter phase of a different kind on the surface of each of the particles taken out in the high vacuum, and the particles each coated with the matter phase of a different kind are deposited on the substrate, or dispersed in the solid matrix material on the substrate, or dispersed in the solution.

The aforesaid manufacturing method may include the step of varying the gas pressure of the inert gas during the laser ablation.

The aforesaid dispersing step may comprise the steps of: depositing the particles taken out in the high vacuum or the particles each coated with the matter phase of a different kind on a substrate thereby to form a thin film comprising the particles; stripping the thin film comprising the particles from the substrate; and dissolving the stripped thin film in a solution to prepare a solution having the particles dispersed therein.

According to the present invention, Seebeck coefficient S and electrical resistivity ρ can be controlled to obtain the maximum thermoelectric conversion efficiency as well as thermal conductivity κ can be lowered. Accordingly, a thermoelectric material in which the dimensionless thermoelectric figure of merit ZT is large, for example, beyond 1.5 can be gotten.

DETAILED DESCRIPTION OF THE PREFERRED EMBODIMENTS

Now, preferred embodiments of the present invention will be described in detail with reference to FIGS. 1 to 3. This invention may, however, be embodied in many different forms and should not be construed as limited to the embodiments set forth hereinafter; rather, these embodiments are provided so that this disclosure will be thorough and complete, and will fully convey the scope of the invention to those skilled in the art.

Figure 1A:
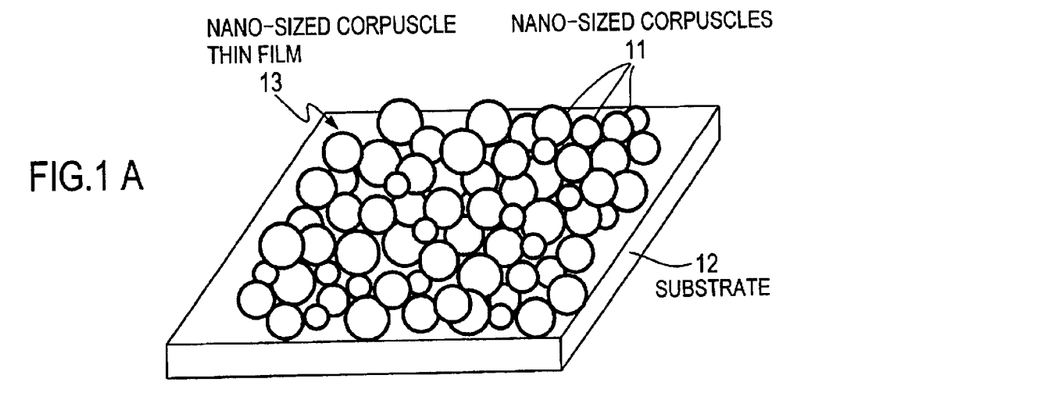
FIG. 1A is an illustrational perspective view showing a first embodiment (a nano-sized corpuscle thin film) of the thermoelectric material according to the present invention.
Figure 2:
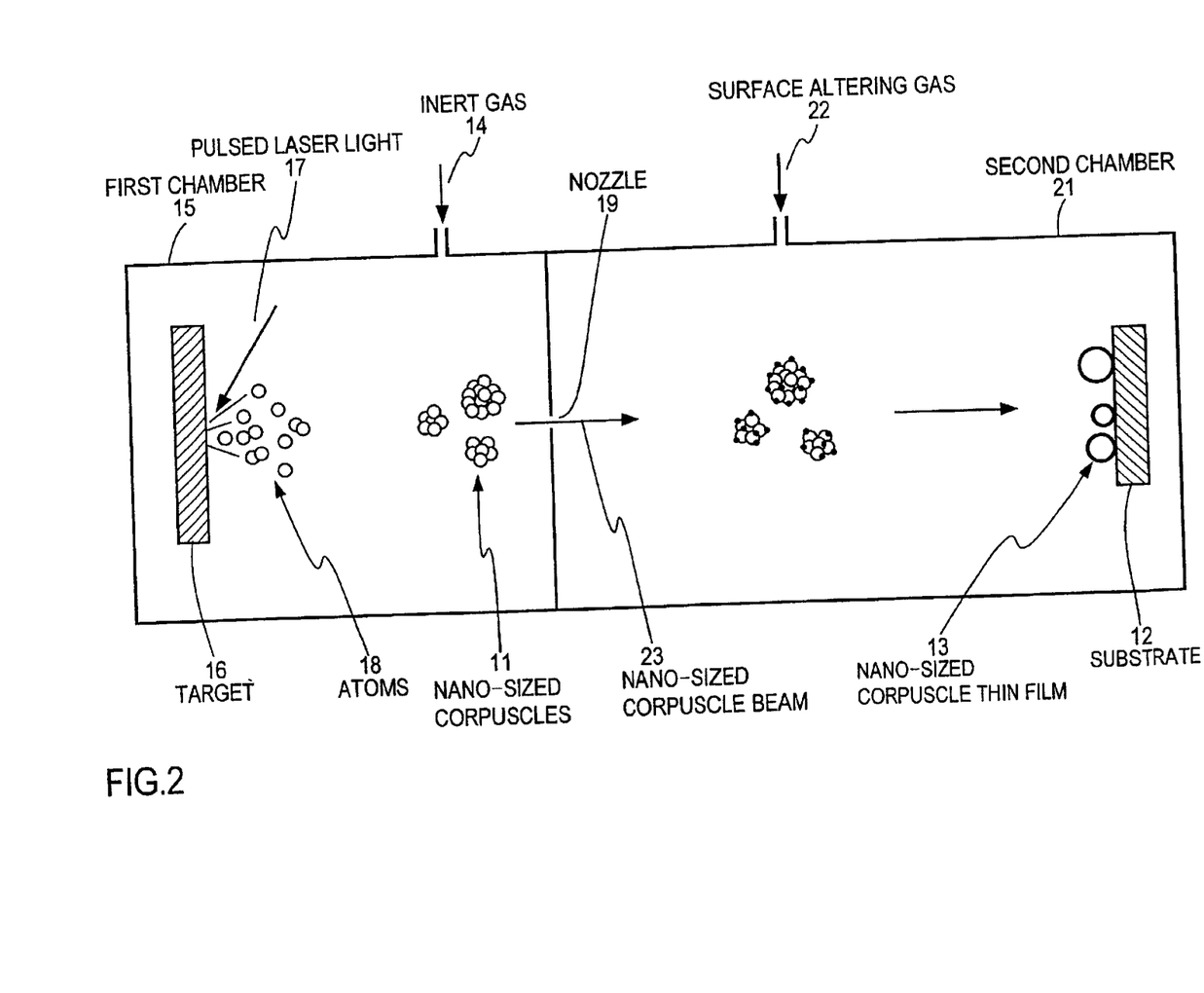
FIG. 2 is an illustrational perspective view for explaining a method of manufacturing the thermoelectric material according to the present invention.

FIG. 1A is an illustrational perspective view showing the constitution of a first embodiment of the thermoelectric material according to the present invention, and FIG. 2 is an illustrational perspective view for explaining a process of manufacturing the thermoelectric material of the first embodiment. As shown in FIG. 1A, the thermoelectric material of this embodiment consists of a thin film of nanometer-sized fine particles 13 formed by depositing on a substrate 12 only nanometer-sized fine particles 11 having their sizes (particle diameters) distributed within the range or limits of 0.5 nm through 100 nm both inclusive, and forming them into a thin film state (hereinafter, the nanometer-sized fine particle will be referred to as nano-sized corpuscle and the thin film of the nanometer-sized fine particles will be referred to as nano-sized corpuscle thin film).

At first, a method of manufacturing the nano-sized corpuscle thin film 13 will be described in detail with reference to FIG. 2.

A target 16 consisting of, for example, a semiconductor bulk material is accommodated in a first chamber 15, and an inert gas 14 such as helium He, argon Ar or the like is introduced into the first chamber 15. In such condition, the target 16 is irradiated with pulsed laser light 17 thereby to cause the target 16 to emit, in a moment, the constituent atoms 18 of the target 16 in large quantities by laser ablation in the inert gas 14. The emitted atoms 18 are cooled via collision reaction in the inert gas atmosphere, and grow to the nano-sized corpuscles 11.

Adjacent to the first chamber 15 is positioned a second chamber 21 which is to be held in high vacuum state, and these chamber 15 and 21 are in communication with each other by a nozzle 19 having its narrow nozzle hole. As a result, the produced nano-sized corpuscles 11 are taken out in the second chamber 21 as a beam 23 through the nozzle 19 of the narrow nozzle hole, the second chamber 21 having been held in high vacuum state (for example, in the order of $10^{-8}$ Torr). That is, the first chamber 15 has the inert gas 14 discharged therein, but it is not in high vacuum state. Therefore, the degree of vacuum in the first chamber 15 is considerably lower than that in the second chamber 21, and hence by this difference between the pressures within the first chamber 15 and the second chamber 21, the nano-sized corpuscles 11 are discharged into the second chamber 21 as the beam 23 from the first chamber through the nozzle 19.

In the second chamber 21 having been held in high vacuum state, in order to stabilize the surfaces of the nano-sized corpuscles 11, a gas (surface altering gas) 22 such as hydrogen H, oxygen O or the like is introduced therein to react the gas with the beam 23 of the nano-sized corpuscles 11, thereby to coat the surface of each of the nano-sized corpuscles 11 (to form a coating on the surface of each of the nano-sized corpuscles 11). The surface-coated nano-sized corpuscles 11 reach the substrate 12 such as a glass substrate accommodated in the second chamber 21, and are deposited on the substrate 12 and are formed into a thin film state. As a result, the nano-sized corpuscle thin film 13 constituted by a large number of the nano-sized corpuscles 11 is formed on the substrate 12. The large number of the nano-sized corpuscles 11 constituting the nano-sized corpuscle thin film 13 are in a state in position and size thereof that they are irregularly or randomly arranged and deposited.

In the above-mentioned process of manufacturing the nano-sized corpuscle thin film 13, the nano-sized corpuscles 11 are so produced in this first embodiment that the diameters thereof distribute within the range of 0.5 nm through 100 nm both inclusive. As a result, the produced nano-sized corpuscles 11 have band gaps generated therein by quantum confinement effects respectively as well as at least a part of the nano-sized corpuscles 11 supply carries, and hence the nano-sized corpuscle thin film 13 comes to have electrical conduction.

In order to produce the nano-sized corpuscles 11 the diameters of which distribute within the range of 0.5 nm through 100 nm both inclusive, in the first embodiment, the pressure of the inert gas 14 in the first chamber 15 is set to a value within the range of 0.1 Torr through 760 Torr both inclusive.

In such manner, in the above-mentioned first embodiment, it is characterized that the nano-sized corpuscles 11 the sizes of which distribute within the range of 0.5 nm through 100 nm both inclusive are produced from the material of the target 16 by the laser ablation in the inert gas 14, and that the nano-sized corpuscles 11 are taken out in the vacuum as the beam 23, thereby to deposit them on the substrate 12 and to form the nano-sized corpuscle thin film 13 including only the nano-sized corpuscles on the substrate 12. This nano-sized corpuscle thin film 13 will be used as a thermoelectric material.

In the nano-sized corpuscle thin film including only the nano-sized corpuscles, not only the electrical and thermal natures or properties that each of the nano-sized corpuscles has but also conductions of electrons (or holes) and heat occurring between the nano-sized corpuscles determine the thermoelectric nature or property of the thin film. For this feature, the nano-sized corpuscle thin film including only the nano-sized corpuscles can be controlled in such manner that the electrical property and the thermal property thereof are individually and separately controlled. Consequently, it is possible to obtain a thermoelectric material the conversion efficiency of which is high.

Specifically speaking, it is considered that since there will occur scattering of phonon when the thermal conduction comes about between the nano-sized corpuscles of the nano-sized corpuscle thin film, the mean free path of the phonon can be reduced to one shorter than the corpuscle size. Moreover, it is also considered that since the sizes of the nano-sized corpuscles are not uniform and distribute within the predetermined limits, irregularity is introduced into the scattering process, which contributes to the shortening of the mean free path of the phonon.

That is to say, due to that the phonon always suffers scattering between the nano-sized corpuscles deposited in the manner that both the position and size thereof are random, the mean free path of the phonon is greatly reduced as compared with that of an ordinary semiconductor crystal. For this reason, as an inherent feature of that structure, the thermal conductivity κ is decreased independently of the electrical property, and it is possible to reduce $κ_{lattice}$ down to the same degree as that of a glass material.

On the other hand, the band structure of each of the nano-sized corpuscles changes by quantum effect and/or surface effect, or due to the advent of a new particle structure which is different from the crystal structure of a bulk so that the electrical property thereof varies with its size. Therefore, the thermally generated electromotive force (Seebeck coefficient S) and the electrical conduction (electrical resistivity ρ) can be controlled by changing the sizes of the nano-sized corpuscles.

As discussed above, the nano-sized corpuscle thin film has a characteristic or feature that the thermal conductivity κ thereof can be decreased as well as the electrical property thereof can be optimized so that the maximum thermoelectric conversion efficiency is obtained. Accordingly, there can be materialized a thermoelectric material the dimensionless thermoelectric figure of merit ZT of which is large, such as beyond 1.5.

A method of manufacturing a thermoelectric material using the laser ablation method is disclosed in, for example, Patent Application Public Disclosure No. hei 9-97931 (97931/1997). In this prior art, a target and a substrate are opposed to each other and accommodated in a vacuum chamber. Therefore, it is impossible to avert a phenomenon that atoms and/or ions emitted from the target have reached the substrate and attached thereto before they have grown to particles, and/or a phenomenon that particles each having its size in the order of micrometer called droplet, which are emitted directly from the surface of the target, have been attached to the substrate. For this reason, it is difficult to produce a thin film including only the nano-sized corpuscles. Since the number of the droplets is approximately 10% or less in the total number of atoms emitted from the target by the laser ablation, the property of a thin film to be formed on the substrate should be determined by the remaining particles (crystals) accounting for 90% or more of the total number of atoms, the remaining particles being emitted in the state of atoms and molecules or molecular particles and growing in inert gas as crystals. The prior art does not disclose as to by what group of sizes of crystal particles the crystal thin film formed by growth of the atoms and molecules is constituted. However, even if the size of each of the droplets is controlled as in the prior art, an effective improvement in the thermoelectric characteristic should not be attained unless the sizes of the crystal particles of the grown thin film accounting for 90% or more are controlled.

In case of using the laser ablation method, it is possible to easily produce the nano-sized corpuscles 11 each of which maintains the same ratio as the ratio of the constituent atoms of the bulk material 16. Generally, the nano-sized corpuscles 11 produced in the inert gas have a wide distribution of size (particle diameter). For this reason, in the present invention, by controlling the pressure of the inert gas, nano-sized corpuscles distributing within the range of 0.5 nm through 100 nm both inclusive are produced.

Specifically explaining, in order to produce nano-sized corpuscles the sizes (particle diameters) of which distribute within the range of 0.5 nm through 100 nm both inclusive by reacting in an inert gas atoms emitted from a target by the laser ablation, the pressure of the inert gas (hereinafter referred to simply as the gas pressure) is set within the range of 0.1 Torr through 760 Torr both inclusive. The gas pressure is controlled by controlling a flow of the gas while the chamber is evacuating by use of a vacuum pump. The reason that the gas pressure is set to such numerical values is that, as a result of the experiments made by the inventors, in case of the gas pressure less than 0.1 Torr, the nano-sized corpuscles are not produced, and in case of the gas pressure more than 760 Torr (atmospheric pressure), the gas pressure cannot be controlled due to the balance of the evacuation and the gas flow.

Next, in order to deposit only nano-sized corpuscles growing in the inert gas on the substrate, in the present invention, only the produced nano-sized corpuscles are discharged into the vacuum as a beam by evacuation based on a pressure difference to deposit them on the substrate. Concretely, the nano-sized corpuscles having grown are taken out in the high vacuum side through a nozzle (its nozzle hole is equal to or less than 1 mm) located at a position several mm above the surface of the target. Since only the nano-sized corpuscles are contained in the beam having been discharged into the high vacuum side, it is possible to form on the substrate a thin film that includes only the nano-sized corpuscles distributing in sizes thereof within the range of 0.5 nm through 100 nm both inclusive.

According to the experiments made by the inventors, in case the nano-sized corpuscles have been made to have their sizes equal to or less than 100 nm, it has been found that a nature or property appears which is remarkably different from that of a particle having its size greater than 100 nm (hereinafter the particle will be referred to as bulk crystal). This is considered to be due to that the quantum effect appears in the area of size equal to or less than 100 nm, and that a ratio of the surface of the bulk crystal to its volume is high and the reconstruction structure of the particle surface peculiar to this size area can determine the electron state thereof. Accordingly, a matter or substance comprising the nanometer-sized particles should be treated as a new and novel phase of matter different from an amorphous matter as well as the bulk crystal.

For example, it has been pointed out that bismuth Bi is a semimetal in the state of bulk crystal which cannot be used as a thermoelectric material, but in case bismuth is formed into a fine wire (nano-wire) the diameter of which is equal to or less than 100 nm, a band gap is produced therein by quantum confinement effect so that it becomes a semiconductor (for example, see G. Dresselhause, M. S. Dresselhause, Z. Zhang, X. Sun, J. Ying, and G. Chen, "Modeling Thermoelectric Behavior In Bi Nano-Wires", Proceedings ICT 1998 (17th International Conference on Thermoelectronics, 1998), pp. 43–46). In other words, the electrical property thereof can be greatly changed by changing the size thereof. This means that a material which has not been utilized as a thermoelectric material in the state of the bulk crystal comes to a material which can be utilized as a thermoelectric material by making it a nanometer-sized one. Accordingly, the extent of discretion of selecting a material as a thermoelectric material becomes considerably wide since it is unhampered by already known materials. It is possible to simplify the composition of a thermoelectric material and to materialize a thermoelectric material having large thermoelectric figure of merit by using a heavy element which is advantageous to a thermoelectric material.

From a point of view in reduction of the thermal conductivity κ, it is advantageous to make the particle size (crystal particle) small as much as possible, and eventually, a material the crystal size of which has become to zero as in an amorphous material is ideal. In the present invention, a thermoelectric material includes many small-sized particles in order to lower the thermal conductivity κ as well as includes particles larger in size than such small-sized particles in order to obtain the optimal electrical properties (electrical resistivity ρ and Seebeck coefficient S). That is to say, there is a distribution in sizes (particle diameters) of the nano-sized particles constituting the nano-sized corpuscle thin film.

Taking bismuth for example, when the particle sizes thereof are reduced by the quantum effects so that the band gaps are increased, the small-sized particles approach insulators more and more so that they cease from supplying carriers. However, if large-sized particles that approach semiconductors or semimetals respectively are mixed, a current flows through these large-sized particles so that as the whole of the thin film, the thermal conductivity thereof can be reduced due to scatterings by the small-sized particles as compared with a thin film not including the small-sized particles as well as the electrical conduction thereof can be secured through the large-sized particles. That is to say, because of the nano-sized corpuscles the sizes of which are distributing within the predetermined limits, it is possible that the thin film has lower thermal conductivity as well as larger electrical conduction and thermally generated electromotive force using the same substance. Further, since the distribution of sizes by which the largest thermoelectric figure of merit can be obtained differs depending upon substances, it is preferred to carry out the optimization of the distribution by varying the distribution of sizes.

Moreover, it is also considered regarding the thermal conductivity κ in addition to the effects relating to the aforesaid electrical properties (electrical resistivity ρ and Seebeck coefficient S) that the distribution of particle sizes performs the role of inducing strong scattering of phonon to lower the thermal conductivity due to that the positions of deposition of the nano-sized corpuscles on the substrate become random, as already discussed. In addition, it is considered that due to the distribution of sizes, an irregularity is introduced in the scattering process of phonon, which contributes a further reduction of the mean free path of the phonon.

Thus, by minimizing the particle sizes to nanometer-sizes, it is possible to reduce the mean free path of the phonon thereby to lower $\kappa_{lattice}$ to the same level as that of a glass material.

Further, since the nano-sized corpuscles have a tendency to be freely and randomly deposited on the substrate without any special contrivance or means, it can be said that the present invention has also utilized this point.

The aforesaid range of the particle sizes to attain the effects in improvement of the thermoelectric figure of merit is 0.5 nm through 100 nm according to the experiments made by the inventors. This range is an area which is larger than the areas of atoms and molecules (<0.5 nm) and smaller than 100 nm in which particles become substantially bulk single crystal state, and this area is one in which a remarkable change of a property of matter such as the quantum size effect or the like appears.

As discussed above, the average particle diameter of the nano-sized corpuscles produced in the inert gas depends on the gas pressure. Giving an example thereof, in case of nano-sized corpuscles each consisting of silicon Si, the average particle diameter of the corpuscles produced in helium gas under the gas pressure of 2.5 Torr and the average particle diameter of the corpuscles produced in helium gas under the gas pressure of 10 Torr become 12 nm and 20 nm, respectively (for example, see T. Yoshida, S. Yakeyama, Y. Yamada, and K. Mutoh, "Nanometer-sized silicon crystallites prepared by excimer laser ablation in constant pressure inert gas", Appl. Phys. Lett. Vol. 68, No. 13, 25 Mar. 1996, pp. 1772–1774). The width of distribution of the particle sizes is in the order of 30% of the average particle diameter which is a typical value. It is possible to produce a group of nano-sized corpuscles including particles the average particle diameter of which is several ten nm and the largest particle diameter of which is in the order of 100 nm by use of higher gas pressure than the above. A group of nano-sized corpuscles having the size distribution determined by the gas pressure as mentioned above are produced per one shot of the laser ablation, and they reach the substrate.

In order to obtain a nano-sized corpuscle thin film the thickness of which is 1 μm, accumulation of the laser shots in the order of $10^4$ is required though it depends upon fluence of the laser ablation and/or the condition of the substrate position. Therefore, if the inert gas pressure are continuously varied in the accumulation of the laser shots, for example, from 1 Torr to several hundreds Torr within the rage of 0.1 Torr through 760 Torr both inclusive, a desired thin film including the nano-sized corpuscles having their sizes of 0.5 nm through 100 nm both inclusive can be favorably produced. The shape of the size distribution can be freely altered by controlling the variation of the gas pressure.

Gases such as hydrogen, oxygen, nitrogen and the like can be used as a surface altering gas 22 for coating the surfaces of the nano-sized corpuscles. Each of such gases is made radical state (atomic state) to hit on the nano-sized corpuscles, thereby to form a coating on each of the surfaces of the nano-sized corpuscles by, for example, hydrogenating, oxidizing or nitrogenizing the surfaces thereof and to stabilize the surfaces. Alternatively, it may be possible to blow an altering gas in molecular gas state directly against the nano-sized corpuscles to induce the surface reaction on each of the nano-sized corpuscles, thereby to alter the surface layer thereof. Action and effect of the coating are as follows.

First, since such coating terminates a dangling bond or bonds on the surface of each of the nano-sized corpuscles, reactiveness between the particles or between the particles and atmosphere can be lowered, and hence the electrical characteristic of the nano-sized corpuscle thin film can be stabilized. In case the nano-sized corpuscles are deposited on the substrate as a result of reaction between the corpuscles, there is a possibility that the nano-sized corpuscles cohere with one another so that larger sized particles can be produced. However, as in the present invention, in case the nano-sized corpuscles are coated in their surfaces in the step of a cluster beam in which the individual corpuscles are existing independently and thereafter the surface-coated corpuscles are deposited on the substrate, the above phenomenon as larger sized particles can be produced can be avoided.

Moreover, in addition thereto, by changing thickness and/or kind of the surface layer of each corpuscle (this can be done by controlling a coating source), there are obtained effects that freedoms of controls of the electrical resistivity $\rho$, Seebeck coefficient S, and the thermal conductivity $\kappa$ can be further increased and that it contributes to further improvement of the thermoelectric conversion characteristic.

By applying such coating according to this method, the resulting coating has one to several atomic layers (when converted into thickness, it is less than 1 nm or so, which is so thin that a tunnel effect can occur) of the surface of each of the nano-sized corpuscles at most. Accordingly, the coating affects an electrical conduction between the corpuscles depending upon height of the potential barrier formed by the surface layer (coating) of each corpuscle within the range in which it does not become electrically a complete insulation layer. In addition, the thermally generated electromotive force is affected by change in electron state of the corpuscle surface. As a result, the electrical natures or properties (electrical resistivity $\rho$, Seebeck coefficient S) can be controlled.

On the other hand, as to the thermal conduction, a coating gas (surface altering gas) and the surface of each of the nano-sized corpuscles react with each other so that a portion that has originally been part of each nano-sized corpuscle changes into a matter phase (surface layer) of a different kind. Consequently, an effect that the thermal conductivity $\kappa$ is further lowered is obtained by both that sizes of the core potions of the nano-sized corpuscles are further reduced and that in case the nano-sized corpuscles have been modified in their surfaces by surface layers each containing a heavy element, the existing surface layers reduce the thermal conduction.

As a material of the target 16, in addition to Bi, there may be used materials already used as thermoelectric materials in bulk such as Bi—Te system materials, skutterudite materials such as $CoSb_3$ or the like, Si—Ge system mixed crystal materials. Especially, it is preferable to use an elementary material such as Bi and materials that are safety as well as low in cost on the basis of Si.

In the first embodiment discussed above, the nano-sized corpuscle thin film 13 has been formed by depositing directly on the substrate 12 only the nano-sized corpuscles 11 having their sizes of 0.5 nm through 100 nm both inclusive. It is to be understood, however, that the present invention is not limited to such embodiment.

Figure 1B:
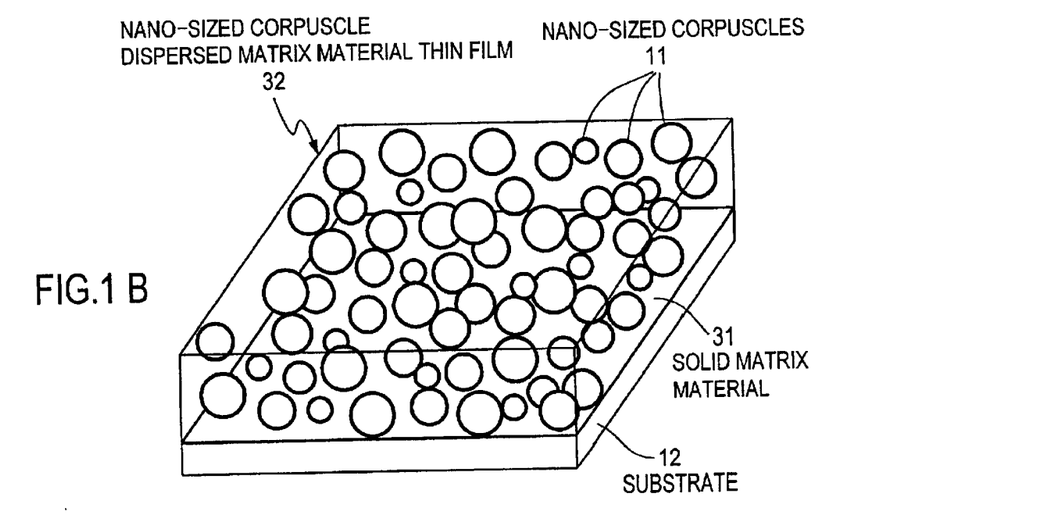
FIG. 1B is an illustrational perspective view showing a second embodiment (a nano-sized corpuscle dispersed matrix material thin film) of the thermoelectric material according to the present invention.

FIG. 1B is an illustrational perspective view showing a second embodiment of the thermoelectric material according to the present invention. In this second embodiment, as in the first embodiment shown in FIG. 1A, a nano-sized corpuscle thin film 32 is formed by taking nano-sized corpuscles 11 having their sizes of 0.5 nm through 100 nm both inclusive, which have been produced in an inert gas, out in a vacuum as a beam, and dispersing the nano-sized corpuscles 11 in a solid medium (solid matrix material or dispersion medium) 31 provided on a substrate 12 thereby to bury them in the solid matrix material 31. Hereinafter, the nano-sized corpuscle thin film 32 having the nano-sized corpuscles dispersed in the solid matrix material 31 (namely, the nano-sized corpuscle thin film 32 of a dispersed system or dispersoid) will be referred to as nano-sized corpuscle dispersed matrix material thin film or dispersed system thin film. Here, electrical conduction in the nano-sized corpuscle dispersed matrix material thin film 32 should occurs through the nano-sized corpuscles, to the bitter end. Therefore, to disperse the nano-sized corpuscles in the solid matrix material (hereinafter referred to simply as solid matrix) 31 does not intend to isolate the nano-sized corpuscles 11 from one another but to disperse the nano-sized corpuscles 11 in the solid matrix 31 so as to fill up a gap occurring between the nano-sized corpuscles deposited in the solid matrix 31 on the substrate 12, thereby to improve the stability of the thin film and to make it easy to handle the thin film.

This nano-sized corpuscle dispersed matrix material thin film 32 can be formed by depositing, when the nano-sized corpuscles 11 are deposited on the substrate 12, a dispersion medium material on the substrate 12 simultaneously with deposition of the nano-sized corpuscles 11 on the substrate 12. In case of such nano-sized corpuscle dispersed matrix material thin film 32, it is also possible to control the electrical nature or property thereof while the thermal conductivity thereof is being held low by selecting a quality of the solid matrix.

Further, as the solid matrix material, insulators each having low thermal conductivity are preferable, and silica glasses, amorphous semiconductor materials such as amorphous silicon and the like, organic materials that are hard to break in addition to inorganic materials such as silica glasses, and the like may be used.

In case of using a silica glass, the solid matrix material can be materialized, when nano-sized corpuscles are deposited on a substrate, by depositing an amorphous $SiO_2$ membrane or film on the substrate simultaneously with the deposition of the nano-sized corpuscles. On the other hand, in case of using an amorphous semiconductor material such as amorphous silicon and the like, if such matrix material has only its electrical conductivity far lower than electrical conduction through the nano-sized corpuscles, the amorphous semiconductor material can be used as the solid matrix material because the electrical conduction of the nano-sized corpuscle dispersed matrix material thin film occurs through the nano-sized corpuscles. Accordingly, it is unnecessary to limit the solid matrix material to a perfect insulator such as silica glass.

In case of using organic materials that are hard to break other than inorganic materials such as silica glass, it is formed as a thin film in which the nano-sized corpuscles have been maintained in a flexible organic material, and hence the breakage and/or damage of the thin film can be avoided. Accordingly, it is possible to form the nano-sized corpuscle dispersed matrix material thin film into a sheet-like thin film having a large area.

Though the nano-sized corpuscle dispersed matrix material thin film 32 shown in FIG. 1B is one in which the nano-sized corpuscles have been dispersed in the solid matrix, by using, for example, a solution instead of the solid matrix, a solution into which the nano-sized corpuscles have been dispersed (hereinafter referred to as nano-sized corpuscle dispersed solution) may be prepared. Such nano-sized corpuscle dispersed solution can be prepared by, for example, stripping off the nano-sized corpuscle thin film 13 shown in FIG. 1A from the substrate 12 and soaking it into the solution to dissolve it therein.

In case such nano-sized corpuscle dispersed solution has been prepared, a thermoelectric conversion element can be formed by, for example, application of the solution. Further, in order to prevent corpuscles from cohering thereby to prepare a nano-sized corpuscle dispersed solution, it is preferred as the solution in which the nano-sized corpuscles are to be dispersed to use an organic solution serving as a surface-active agent.

Figure 3:
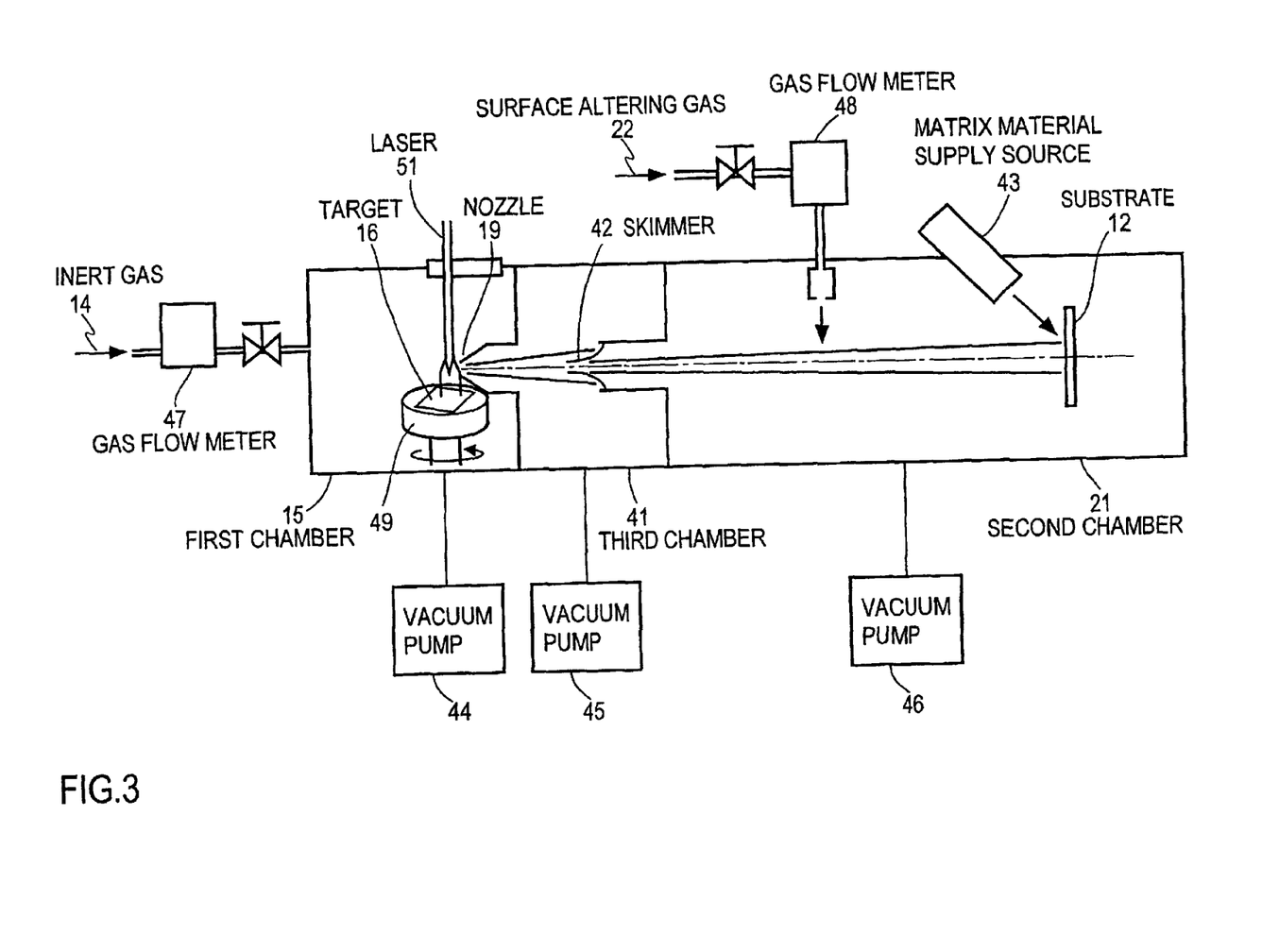
FIG. 3 shows the construction of an example of the thermoelectric material manufacturing apparatus used in manufacturing the thermoelectric material according to the present invention.

FIG. 3 shows the construction of an example of the thermoelectric material manufacturing apparatus used in manufacturing the thermoelectric material according to the present invention, and shows, in outline, a construction of the apparatus for manufacturing a thermoelectric material consisting of the nano-sized corpuscle thin film using the laser ablation method. The illustrated manufacturing apparatus is so configured that both the nano-sized corpuscle thin film 13 of the first embodiment and the nano-sized corpuscle dispersed matrix material thin film 32 of the second embodiment shown in FIGS. 1A and 1B respectively can be manufactured. Now, the construction of the manufacturing apparatus will be described. Further, elements and portions in FIG. 3 corresponding to those shown in FIG. 2 will be denoted by the same reference characters affixed thereto, and the explanations thereof will be omitted unless necessary.

The manufacturing apparatus shown in FIG. 3 is constructed such that between a first chamber 15 and a second chamber 21 is further provided a third chamber 41 in order to make the degree of vacuum in the second chamber 21 higher, and a nozzle 19 is located through a partition or diaphragm between the first chamber 15 and the third chamber 41 as well as a skimmer 42 is located through a partition or diaphragm between the third chamber 41 and the second chamber 21. In addition, a solid matrix material supply source 43 such as $SiO_2$ supply source is provided at the second chamber 21. Further, the respective chambers 15, 41 and 21 have vacuum pumps 44, 45 and 26 connected thereto, respectively, and to the first chamber 15 is connected a gas flow meter 47 for controlling the flux of an inert gas 14 flowing into the first chamber 15 as well as to the second chamber 21 is connected a gas flow meter 48 for controlling the flux of a surface altering gas 22 flowing into the second chamber 21.

A target 16 accommodated in the first chamber 15 is disposed on a sample holder 49 to be rotated, and pulsed laser light is irradiated on the target 16 from a laser 51. In this example, an Nd:YAG laser was used as the laser 51. The inert gas (helium gas in this example) 14 introduced into the first chamber 15 was controlled in its flux by the gas flow meter 47, thereby to control the gas pressure in the first chamber 15 at a required pressure.

In the manufacturing apparatus constructed above, the nano-sized corpuscles having grown in the inert gas in the first chamber 15 are discharged into the third chamber 41 through the nozzle 19 due to a pressure difference caused by a differential pumping, and then, the discharged nano-sized corpuscles are passed through the skimmer 42 to parallelize them so that they are taken out in the second chamber 21 having been held in high vacuum state (in the order of $10^{-7}$ Torr). That is to say, in order to carry out the differential pumping, the third chamber 41 is exhausted by the vacuum pump 45 so that the degree of vacuum therein is lower than the degree of vacuum in the first chamber 15 as well as is higher than the degree of vacuum in the second chamber 21.

In this example, the pressure in the first chamber 15 was set at 5 to 20 Torr, the degree of vacuum in the third chamber 41 at $10^{-3}$ to $10^{-6}$ Torr, and the degree of vacuum in the second chamber 21 at $10^{-7}$ Torr so that the nano-sized corpuscles were discharged into the second chamber 21 as a good molecular beam. However, these values are mere by way of example, and the gas pressure in the first chamber 15 may be set at 0.1 to 760 Torr as already described, the degree of vacuum in the third chamber 41 may be set in vacuum state, namely, at about $10^{-3}$ Torr or lower than it, and the degree of vacuum in the second chamber 21 may be set to a value lower than that in the third chamber 41. The gas pressure in the first chamber 15 depends upon the target material, and it is preferable that the optimum gas pressure is selected depending upon a target material to be used.

A surface altering gas (coating gas) 22 such as oxygen, hydrogen or the like is controlled in its flux by the gas flow meter 48 and introduced into the second chamber 21 having been held in high vacuum state so that the surface altering gas 22 hits against the nano-sized corpuscles in the state of a parallelized beam. As a result, the surfaces of the nano-sized corpuscles are coated. As the case may be, a radical forming apparatus (not shown) may be provided in the second chamber 21, and if the coating gas is passed through the radical forming apparatus, a surface modification of each corpuscle by the atomized gas can be made. The nano-sized corpuscles having coatings thereon are deposited on a substrate 12 together with a matrix material ($SiO_2$ in this example) supplied from the solid matrix material supply source 43 so that the nano-sized corpuscle dispersed matrix material thin film 32 shown in FIG. 1B is formed on the substrate 12.

Alternatively, in case the solid matrix material supply source 43 is not operated and the nano-sized corpuscles having coatings thereon are deposited directly on a substrate 12, the nano-sized corpuscle thin film 13 shown in FIG. 1A can be formed on the substrate 12. Accordingly, the illustrated manufacturing apparatus can manufacture both the nano-sized corpuscle thin film 13 of the first embodiment and the nano-sized corpuscle dispersed matrix material thin film 32 of the second embodiment shown in FIGS. 1A and 1B, respectively.

As a material of the substrate 12, a substrate made of a glass was used in this example, but other materials such as an Si substrate the surface of which is coated with an insulation layer such as $SiO_2$, $Si_3N_4$ or the like may be used.

Further, in order to deposit only the nano-sized corpuscles growing in the inert gas in the first chamber 15 on the substrate 12 in the second chamber 21, it is preferable that the nozzle 19 is located at a position several millimeters above the surface of the target. In addition, it is preferred that the nozzle hole of the nozzle 19 is equal to or less than 1 mm.

As is clear from the foregoing description, in accordance with the present invention, electrical properties (electrical resistivity ρ, Seebeck coefficient S) can be controlled to obtain the maximum thermoelectric conversion efficiency as well as the thermal conductivity $\kappa_{lattice}$ can be reduced down to the same level as that of a glass material. Accordingly, there is obtained a remarkable advantage that a thermoelectric material in which the dimensionless thermoelectric figure of merit ZT is large, for example, beyond 1.5 can be gotten.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the illustrated embodiments, and is intended to encompass all such modifications, alterations, changes, and/or minor improvements falling within the scope of the invention defined by the appended claims.

What is claimed is:

1. A thermoelectric material consisting of a thin film which comprises deposited nanometer-sized particles having their diameters distributing within the range of 0.5 nm though 100 nm both inclusive, wherein said thermoelectric material has a band gap due to quantum confinement effect in each of said nanometer-sized particles and electrical conduction of the thermoelectric material occurs by that at least a part of the nanometer-sized particles supply carriers, and wherein the surface of each of said nanometer-sized particles is coated with a matter formed by a reaction between the particles and a gas.

2. A method of manufacturing a thermoelectric material comprising the steps of:
   irradiating a target material with pulsed laser light in an inert gas the pressure of which is set at 0.1 Torr through 760 Torr both inclusive, causing said target material to emit atoms therefrom by laser ablation, and producing nanometer-sized particles having their diameters distributing within the range of 0.5 nm though 100 nm both inclusive;
   taking the produced nanometer-sized particles out in a high vacuum as a beam through a nozzle;
   forming a matter coating the surface of each of the particles taken out in the high vacuum, wherein the matter is formed by a reaction between the particles and a gas; and
   depositing the particles each coated with said matter.

3. A thermoelectric material consisting of a thin film which comprises nanometer-sized particles dispersed in a solid matrix material and having their diameters distributing within the range of 0.5 nm though 100 nm both inclusive, wherein said thermoelectric material has a band gap due to quantum confinement effect in each of said nanometer-sized particles and electrical conduction of the thermoelectric material occurs by that at least a part of the nanometer-sized particles supply carriers, and wherein the surface of each of said nanometer-sized particles is coated with a matter formed by a reaction between the particles and a gas.

4. A method of manufacturing a thermoelectric material comprising the steps of:
   irradiating a target material with pulsed laser light in an inert gas the pressure of which is set at 0.1 Torr through 760 Torr both inclusive, causing said target material to emit atoms therefrom by laser ablation, and producing nanometer-sized particles having their diameters distributing within the range of 0.5 nm though 100 nm both inclusive;
   taking the produced nanometer-sized particles out in a high vacuum as a beam through a nozzle;
   forming a matter coating the surface of each of the particles taken out in the high vacuum, wherein the matter is formed by a reaction between the particles and a gas; and
   dispersing the particles each coated with said matter in a solid matrix material on a substrate.

5. A thermoelectric material consisting of a thin film which comprises nanometer-sized particles having their diameters distributing within the range of 0.5 nm though 100 nm both inclusive, said thin film being formed by application of a solution having the nanometer-sized particles dispersed therein, wherein said thermoelectric material has a band gap due to quantum confinement effect in each of said nanometer-sized particles and electrical conduction of the thermoelectric material occurs by that at least a part of the nanometer-sized particles supply carriers, and wherein the surface of each of said nanometer-sized particles is coated with a matter formed by a reaction between the particles and a gas.

6. A method of manufacturing a thermoelectric material comprising the steps of:
   irradiating a target material with pulsed laser light in an inert gas the pressure of which is set at 0.1 Torr through 760 Torr both inclusive, causing said target material to emit atoms therefrom by laser ablation, and producing nanometer-sized particles having their diameters distributing within the range of 0.5 nm though 100 nm both inclusive;
   taking the produced nanometer-sized particles out in a high vacuum as a beam through a nozzle;
   dispersing the particles taken out in the high vacuum in a solution; and
   applying said solution having the particles dispersed therein to form a thin film.

7. The method of manufacturing a thermoelectric material as set forth in claim 6, wherein said dispersing step comprises:
   depositing the particles taken out in the high vacuum on a substrate thereby to form a thin film comprising the particles;
   stripping said thin film comprising the particles from said substrate; and
   dissolving the stripped thin film in a solution to prepare a solution having the particles dispersed therein.

8. A method of manufacturing a thermoelectric material comprising the steps of:
   irradiating a target material with pulsed laser light in an inert gas the pressure of which is set at 0.1 Torr through 760 Torr both inclusive, causing said target material to emit atoms therefrom by laser ablation, and producing nanometer-sized particles having their diameters distributing within the range of 0.5 nm though 100 nm both inclusive;
   taking the produced nanometer-sized particles out in a high vacuum as a beam through a nozzle;
   forming a matter coating the surface of each of the particles taken out in the high vacuum, wherein the matter is formed by a reaction between the particles and a gas; and dispersing the particles each coated with said matter in a solution; and applying said solution having the particles dispersed therein to form a thin film.

9. The method of manufacturing a thermoelectric material as set forth in claim 8, wherein said dispersing step comprises:

depositing the particles each coated with said matter on a substrate thereby to form a thin film comprising the particles;

stripping said thin film comprising the particles from said substrate; and dissolving the stripped thin film in a solution to prepare a solution having the particles dispersed therein.

10. The method of manufacturing a thermoelectric material as set forth in any one of claim 2, 4, 6 or 8, further including the step of varying the gas pressure of said inert gas during the laser ablation.

* * * * *